(12) United States Patent
Ferrario et al.

(10) Patent No.: US 8,963,589 B1
(45) Date of Patent: Feb. 24, 2015

(54) RAMP GENERATOR CIRCUIT

(71) Applicants: STMicroelectronics S.r.l., Agrate Brianza (IT); STMicroelectronics Asia Pacific Pte. Ltd., Singapore (SG)

(72) Inventors: Lorenzo Ferrario, Singapore (CG); Roberto Trabattoni, Oggiona Con Santo Stefano (IT)

(73) Assignees: STMicroelectronics S,r.l., Agrate Brianza (MB) (IT); STMicoelectronics Asia Pafific Pte. Ltd., Singapore (SG)

( * ) Notice: Subject to any disclaimer, the term of this patent is extended or adjusted under 35 U.S.C. 154(b) by 0 days.

(21) Appl. No.: 14/152,270

(22) Filed: Jan. 10, 2014

(51) Int. Cl.
H03K 4/06 (2006.01)
H03K 4/08 (2006.01)

(52) U.S. Cl.
CPC .......................................... *H03K 4/08* (2013.01)
USPC ............................................ 327/134; 327/131

(58) Field of Classification Search
USPC .................................................. 327/131–134
See application file for complete search history.

(56) References Cited

U.S. PATENT DOCUMENTS

| | | | | |
|---|---|---|---|---|
| 5,070,311 A * | 12/1991 | Nicolai | ......................... | 331/111 |
| 5,349,311 A * | 9/1994 | Mentzer | ......................... | 331/57 |
| 5,477,174 A * | 12/1995 | Capener et al. | ................ | 327/131 |
| 5,912,593 A * | 6/1999 | Susak et al. | .................... | 331/111 |
| 6,603,366 B2 * | 8/2003 | Huang et al. | ................... | 331/111 |
| 7,138,880 B2 * | 11/2006 | Ma et al. | ........................ | 331/143 |
| 7,420,431 B2 * | 9/2008 | Hwang et al. | .................. | 331/143 |
| 7,474,086 B2 * | 1/2009 | Chen et al. | ..................... | 323/288 |
| 8,089,255 B2 * | 1/2012 | Chen | .............................. | 323/282 |
| 8,115,563 B2 * | 2/2012 | Odagiri | ......................... | 332/109 |
| 8,427,128 B2 * | 4/2013 | Tsai | ............................... | 323/284 |
| 2007/0241733 A1 * | 10/2007 | Chen et al. | ..................... | 323/288 |
| 2010/0164563 A1 * | 7/2010 | Bea et al. | ....................... | 327/132 |
| 2012/0019225 A1 * | 1/2012 | Tsai | .............................. | 323/284 |

* cited by examiner

*Primary Examiner* — Ryan Jager
(74) *Attorney, Agent, or Firm* — Gardere Wynne Sewell LLP

(57) ABSTRACT

An oscillator circuit selectively charges and discharges a capacitor with currents having variable magnitudes. A trimming circuit functions to measure a half period of the oscillator signal. The measured half period is compared to a reference period to generate an error signal. The variable magnitudes of one or the other or both of the current for sourcing or sinking at the capacitor are adjusted in response to the error signal.

21 Claims, 7 Drawing Sheets

RAMP GENERATOR CIRCUIT

TECHNICAL FIELD

This invention relates generally to electronic circuits, and more particularly to a ramp generator circuit for use, for example, in connection with a pulse width modulator.

BACKGROUND

Ramp generator circuits are well known in the art. It is a common technique in a ramp generator circuit to provide current sources to alternately charge and discharge a capacitor. The voltage on the capacitor responds to the alternating charge and discharge operation by rising and falling, respectively, with a ramp shape (producing a sawtooth or triangle waveform). However, because of a number of factors including the effects of process, voltage, aging and temperature, it has proven to be quite difficult to control the operation of the ramp generator circuit so that the capacitor voltage rises and falls with a constant and accurate slope over the operating life of the circuit. A number of circuit applications, including for example pulse width modulation, rely on the ramp output of the ramp generator circuit and cannot tolerate inaccuracy in the ramp slope.

There is accordingly a need in the art for a ramp generator circuit having an accurate and constant slope.

SUMMARY

In an embodiment, a ramp generator circuit comprises: a capacitor; a current source circuit configured to generate a source current having a variable magnitude; a first switch configured to selectively apply the source current to the capacitor and generate a ramp signal at said capacitor; and a trimming circuit configured to measure a time taken for the ramp signal to reach a threshold, compare the measured time to a reference time and adjust the variable magnitude of the source current in response to a result of the comparison.

In an embodiment, an oscillator circuit comprises: a capacitor; a current source circuit configured to generate a source current having a variable magnitude; a first switch configured to selectively apply the source current to the capacitor and generate a positive ramp of an oscillator signal at said capacitor; a current sink circuit configured to generate a sink current having a variable magnitude; a second switch configured to selectively apply the sink current to the capacitor and generate a negative ramp of the oscillator signal at said capacitor; a switch control circuit configured to alternately actuate the first and second switches; a trimming circuit configured to measure a half period of the oscillator signal, compare the measured half period to a reference period and adjust the variable magnitude of the source current and sink current in response to a result of the comparison.

In an embodiment, a method of generating a ramp signal comprises: applying a source current having a variable magnitude to a capacitor to generate a ramp signal at said capacitor; measuring a time taken for the ramp signal to reach a threshold; comparing the measured time to a reference time; and adjusting the variable magnitude of the source current in response to a result of the comparison.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF THE DRAWINGS

Figure 1:
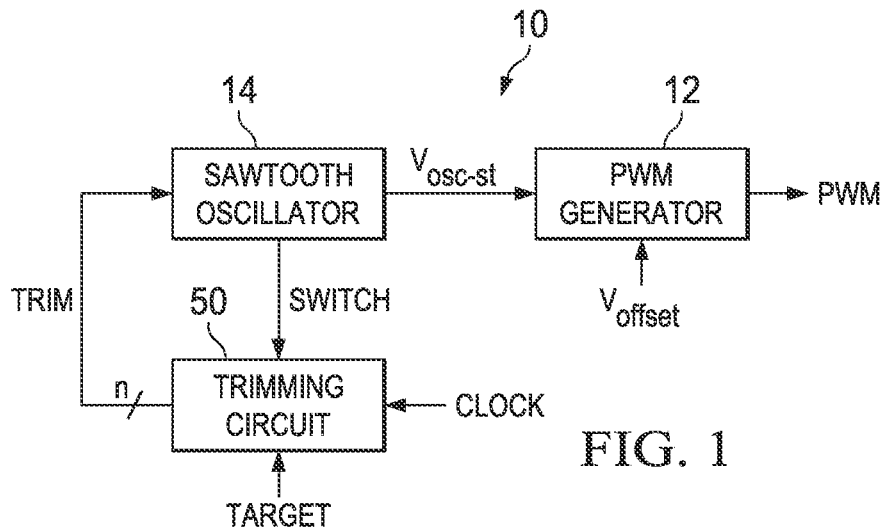
FIG. 1 is a block diagram of a pulse width modulation (PWM) circuit.

Reference is now made to FIG. 1 which illustrates a block diagram of a pulse width modulation (PWM) circuit 10. The circuit 10 includes a PWM generator 12 configured to receive a sawtooth oscillation signal (Vosc-st) and an offset voltage (Voffset). The PWM generator 12 operates to generate a PWM output signal (PWM). The offset voltage Voffset signal represents the information signal to be modulated. The PWM generator 12 functions to generate the PWM output signal having a duty cycle which is a function of the magnitude of the offset voltage Voffset signal.

PWM generator 12 circuits are well known to those skilled in the art and specific details of the generator 12 need not be presented herein. However, those skilled in the art understand that the PWM generator 12 may comprise a window-type comparison circuit functioning to compare the sawtooth oscillation signal Vosc-st against two thresholds, one high and one low, with the logic state of the comparison output signal (the signal PWM) changing each time the sawtooth oscillation signal Vosc-st crosses one of the thresholds.

Figure 2:
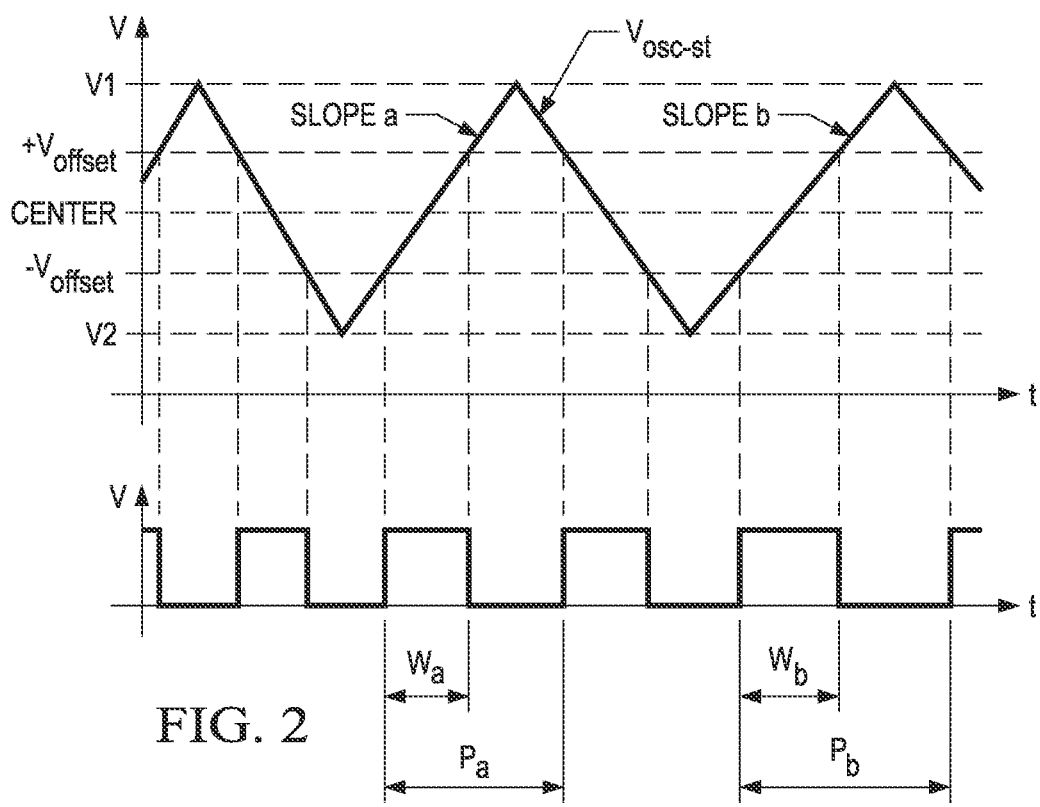
FIG. 2 illustrates operation of a PWM generator.

FIG. 2 illustrates the operation of the PWM generator 12. The offset voltage signal defines two threshold voltages (+Voffset and −Voffset) relative to a center voltage (Center) of the sawtooth oscillation signal Vosc-st. The two threshold voltages +Voffset and −Voffset are applied in a comparison operation by the PWM generator 12 against the voltage of the sawtooth oscillation signal Vosc-st. Each time the sawtooth oscillation signal Vosc-st crosses one of the two threshold voltages +Voffset and −Voffset, the logic state of the PWM output signal changes. As a result, the duty cycle of the PWM output signal is dependent on the magnitude of the offset voltage (Voffset) signal.

It is important, however, that the frequency of the sawtooth oscillation signal Vosc-st be fixed and regulated. Any drift in the frequency of the sawtooth oscillation signal Vosc-st will cause a change in the slope of the sawtooth waveform and result in a change in the period of the PWM output signal. This issue is illustrated in FIG. 2 where a change in the slope of the sawtooth waveform from a first slope a to a second slope b occurs resulting in a change in the width of the generated pulse of the PWM output signal from a first width Wa to a second (greater) width Wb and a corresponding change in the period of the PWM output signal from a first period Pa to a second (greater) period Pb. Regulation of the frequency of the sawtooth oscillation signal Vosc-st can be accomplished by monitoring and controlling the slope (positive and negative) of the waveform. This is important because incorrect frequency of the PWM signal can result in mechanical resonance concerns when the PWM signal drives a motor, for example.

Figure 3:
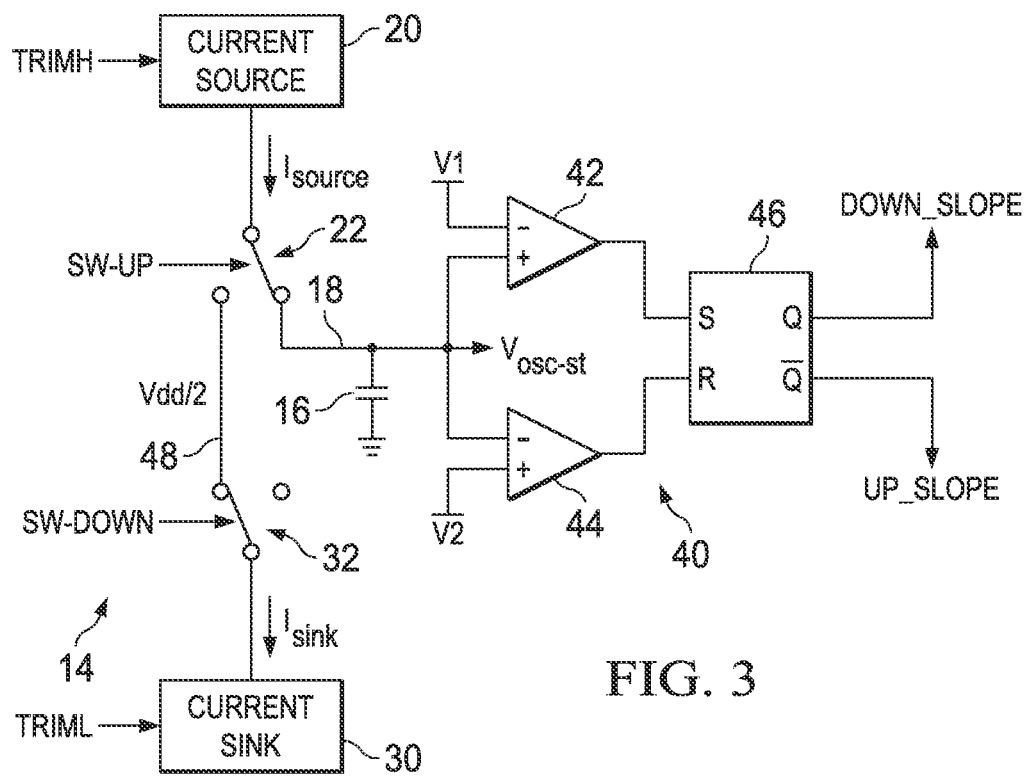
FIG. 3 illustrates a circuit diagram of a sawtooth signal generator.

Reference is once again made to FIG. 1. The circuit 10 further includes a sawtooth (or triangle) signal generator 14 configured to generate the sawtooth oscillation signal Vosc-st. A circuit diagram of the sawtooth signal generator 14 is illustrated in FIG. 3. The generator 14 includes a capacitor 16, coupled between an output node 18 and a ground reference node, that is alternately charged and discharged to generate the sawtooth oscillation signal Vosc-st. A current source circuit 20 is provided to generate a source current Isource that is selectively applied to the output node 18 in response to the operation of a first switching circuit 22. A current sink circuit 30 is provided to generate a sink current Isink that is selectively applied to the output node 18 in response to the operation of a second switching circuit 32. The first and second switching circuits 22 and 32 are alternately actuated in response to control signals SW-UP and SW-DOWN, respectively. When the first switching circuit 22 connects the current source circuit 20 to the output node 18, current is sourced to charge the capacitor 16 and the voltage at the output node 18 rises with a positive slope. Conversely, when the second switching circuit 32 connects the current sink circuit 30 to the output node 18, current is sunk to discharge the capacitor 16 and the voltage at the output node 18 falls with a negative slope. The value of the slopes (i.e., the rate of change), positive and negative, is dependent on the magnitude of the source current Isource and sink current Isink.

The generator 14 further includes a switch control circuit 40 including a first comparator 42 having a non-inverting input terminal coupled to the output node 18 and an inverting input terminal coupled to receive a first reference voltage V1 which sets the top voltage of the sawtooth oscillation signal Vosc-st (see, FIG. 2). If the voltage at node 18 is less than the first reference voltage V1, then the output of the first comparator 42 is logic low. Conversely, when the voltage at node 18 exceeds the first reference voltage V1, the output of the first comparator 42 switches to logic high. The first comparator 42 accordingly tests for when the voltage of the sawtooth oscillation signal Vosc-st rises to reach the first reference voltage V1 (indicating the start of the down slope of the sawtooth oscillation signal Vosc-st).

The switch control circuit 40 also includes a second comparator 44 having an inverting input terminal coupled to the output node 18 and a non-inverting input terminal coupled to receive a second reference voltage V2 which sets the bottom voltage of the sawtooth oscillation signal Vosc-st (see, FIG. 2). If the voltage at node 18 is more than the second reference voltage V2, then the output of the second comparator 44 is logic low. Conversely, when the voltage at node 18 is less than the second reference voltage V2, the output of the second comparator 44 switches to logic high. The second comparator 44 accordingly tests for when the voltage of the sawtooth oscillation signal Vosc-st falls to reach the second reference voltage V2 (indicating the start of the up slope of the sawtooth oscillation signal Vosc-st).

The switch control circuit 40 further includes a flip-flop circuit 46 having a set input (S) coupled to an output of the first comparator 42 and a reset input (R) coupled to an output of the second comparator 44. The flip-flop circuit 46 has complementary outputs Q and Q(bar).

The Q output is set to logic high (and the Q(bar) output set to logic low) by a logic high transition at the set input of the flip-flop circuit when the output of the first comparator 42 transitions to logic high. This occurs when the voltage of the sawtooth oscillation signal Vosc-st rises to reach the first reference voltage V1. In other words, the Q output is has a logic high value when the sawtooth oscillation signal Vosc-st has a falling voltage (i.e., has a negative or down slope). The signal at the Q output is accordingly referred to as the DOWN-SLOPE signal.

The Q(bar) output is set to logic high (and the Q output set to logic low) by a logic high transition at the reset input of the flip-flop circuit when the output of the second comparator 44 transitions to logic high. This occurs when the voltage of the sawtooth oscillation signal Vosc-st falls to reach the second reference voltage V2. In other words, the Q(bar) output has a logic high value when the sawtooth oscillation signal Vosc-st has a rising voltage (i.e., has a positive or up slope). The signal at the Q(bar) output is accordingly referred to as the UP-SLOPE signal.

The first and second switching circuits 22 and 32 are actuated in response to control signals SW-UP and SW-DOWN, respectively. When the SW-UP signal has a first logic state (for example, logic high) the first switching circuit 22 connects the current source circuit 20 to the output node 18 (and capacitor 16). Conversely, when the SW-UP signal has a second logic state (for example, logic low) the first switching circuit 22 disconnects the current source circuit 20 from the output node 18 (and capacitor 16), and may also connect the current source circuit 20 to a reference voltage node 48 (for example, Vdd/2). The operation of the switches 22 and 32 to connect to the reference voltage node 48 is an optional feature provided to set the voltage across the current generator which is not providing charging or discharging current.

When the SW-DOWN signal has a first logic state (for example, logic high) the second switching circuit 32 connects the current sink circuit 30 to the output node 18 (and capacitor 16). Conversely, when the SW-DOWN signal has a second logic state (for example, logic low) the second switching circuit 32 disconnects the current sink circuit 30 from the output node 18 (and capacitor 16), and may also connect the current sink circuit 30 to the reference voltage node 48.

The control signals SW-UP and SW-DOWN may be generated from the UP-SLOPE and DOWN-SLOPE signals. Indeed, in a preferred embodiment, the control signals SW-UP is the UP-SLOPE signal and control signal SW-DOWN is the DOWN-SLOPE signal. The control signals SW-UP and SW-DOWN accordingly are 180° out of phase to provide for alternate actuation of the switches 22 and 32. The UP-SLOPE and DOWN-SLOPE signals may be buffered or otherwise conditioned in order to generate the SW-UP and SW-DOWN signals.

Figure 4:
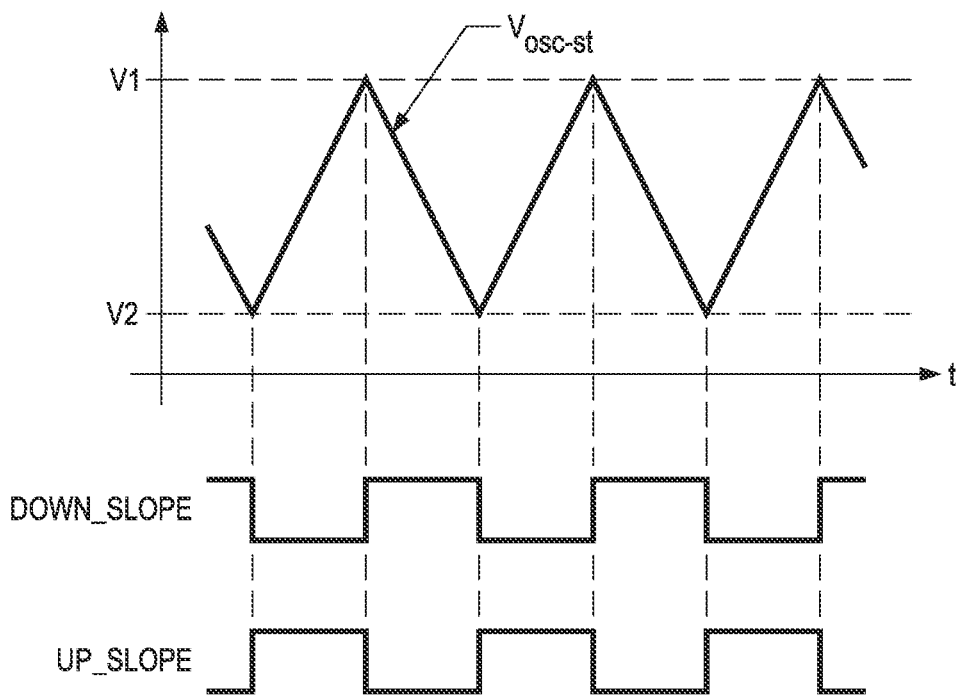
FIG. 4 illustrates operation of the sawtooth signal generator.

The generation of the UP-SLOPE and DOWN-SLOPE signals in response to the sawtooth oscillation signal Vosc-st is illustrated in FIG. 4. The UP-SLOPE signal is logic high when the voltage of the sawtooth oscillation signal Vosc-st is rising. The DOWN-SLOPE signal is logic high when the voltage of the sawtooth oscillation signal Vosc-st is falling.

With reference once again to FIG. 3, the magnitude of the source current Isource generated by the current source circuit 20 is adjustable in response to a trimming control signal TRIMH. The trimming control signal TRIMH is a multi-bit digital signal (for example, a data word, data byte or data nibble) having a value which sets the magnitude of the source current Isource.

The magnitude of the sink current Isink generated by the current sink circuit 30 is adjustable in response to a trimming control signal TRIML. The trimming control signal TRIML is a multi-bit digital signal (for example, a data word, data byte or data nibble) having a value which sets the magnitude of the sink current Isink.

Reference is once again made to FIG. 1. The circuit 10 further includes a trimming circuit 50 which receives a switch signal (SWITCH) output from the sawtooth signal generator 14. The switch signal may comprise one or both of the SW-UP and SW-DOWN signals. Thus, through the received switch signal the trimming circuit 50 is provided with information concerning the operating state of the first and second switching circuits 22 and 32. The trimming circuit 50 further receives a clock reference signal (CLOCK) and a target signal (TARGET). The clock reference signal is a square wave clock signal. The target signal is a multi-bit digital signal (for example, a data word, data byte or data nibble) having a value which represents the desired frequency of the sawtooth oscillation signal Vosc-st. In a preferred embodiment, the value of the target signal is set equal to the desired length of a half period of the sawtooth oscillation signal Vosc-st. Using the clock signal as a time reference, the trimming circuit 50 functions to compare the actual length of time between logic transitions of the switch signal, which occur once every half period of the sawtooth oscillation signal Vosc-st, to the target signal which represents the desired length of a half period of the sawtooth oscillation signal Vosc-st, and generate an error signal indicating the difference between the actual and target. The trimming circuit 50 then generates a trimming signal (TRIM) in response to the error signal which is processed by the sawtooth signal generator 14 to set the magnitude of the source current Isource (through the trimming control signal TRIMH) and set the magnitude of the sink current Isink (through trimming control signal TRIML) so as to drive the error signal to zero.

Figure 5A:
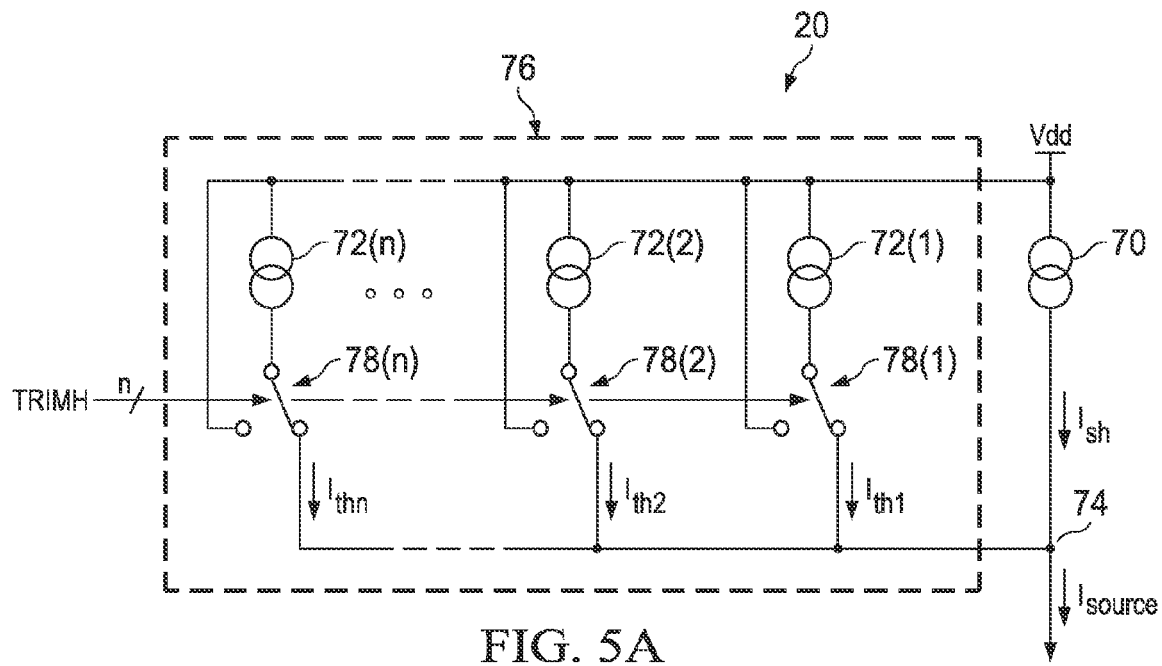
FIGS. 5A and 5B illustrate circuit diagrams for a current source circuit and current sink circuit, respectively.

Reference is now made to FIG. 5A which illustrates a circuit diagram for an embodiment of the current source circuit 20. The current source 20 includes a constant current generator 70 configured to generate a constant current Ish. The current generator 70 is coupled between a positive supply node and an output node 74 which supplies the source current Isource. The current source circuit 20 further includes a trim current source circuit 76 comprised of a plurality of trim current generators 72(1)-72(n), generating trim currents Ith1-Ithn, and a corresponding plurality of switches 78(1)-78(n). Each trim current generator 72 is coupled in series with one switch 78 between the positive supply node and the output node 74. The switches 78(1)-78(n) are selectively actuated in response to the bit values of the trimming control signal TRIMH. When a given switch 78 is actuated, for example by a logic high data bit of the signal TRIMH, the corresponding trim current Ith generated by the trim current generator 72 coupled to the actuated switch 78 is supplied to the node 74 to be added to the constant current Ish and produce the source current Isource output from the current source circuit 20. When a given switch 78 is not actuated, the output of the trim current generator 72 is coupled to the positive supply node so as to shut off the current generator. The constant current generator 70 and trim current generators 72 may have any suitable current sourcing configuration known to those skilled in the art including, for example, an appropriately biased p-channel MOSFET device.

In an embodiment, the trim currents Ith1-Ithn may have identical magnitudes. In another embodiment, the trim currents Ith1-Ithn may have different magnitudes, perhaps having a binary relationship to each other. In a preferred embodiment, the magnitude of each trim current Ith1-Ithn is a multiple of the magnitude of the constant current Ish.

Figure 5B:
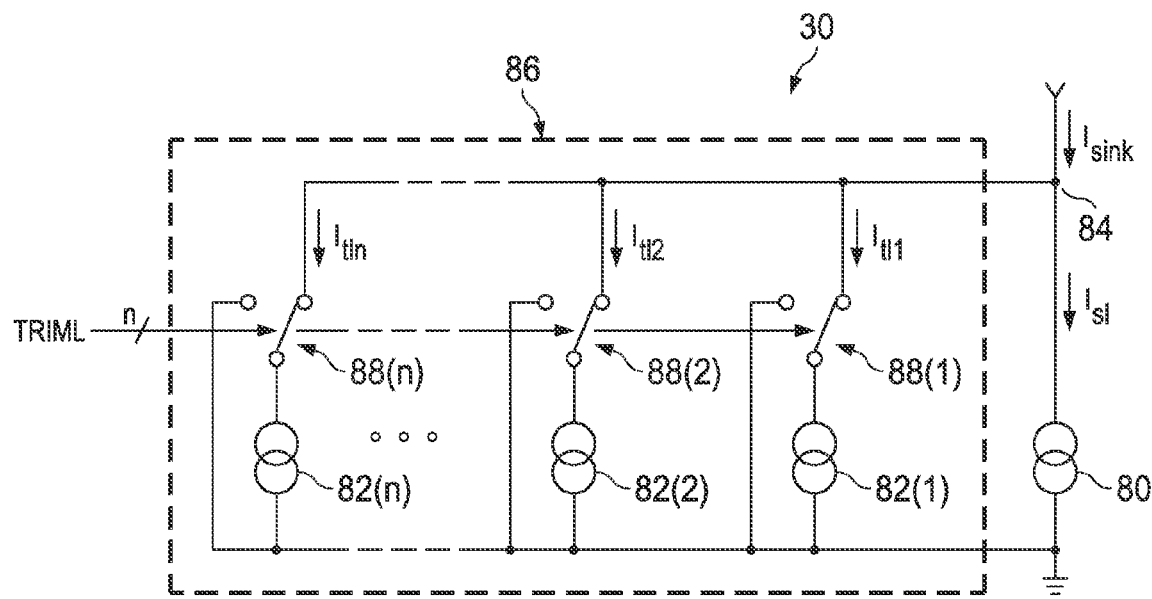

Reference is now made to FIG. 5B which illustrates a circuit diagram for an embodiment of the current sink circuit 30. The current sink 30 includes a constant current generator 80 configured to generate a constant current Isl. The current generator 80 is coupled between a ground supply node and an output node 84 which supplies the sink current Isink. The current sink circuit 30 further includes a trim current sink circuit 86 comprised of a plurality of trim current generators 82(1)-82(n), generating trim currents Itl1-Itln, and a corresponding plurality of switches 88(1)-88(n). Each trim current generator 82 is coupled in series with one switch 88 between the output node 84 and the ground supply node. The switches 88(1)-88(n) are selectively actuated in response to the bit values of the trimming control signal TRIML. When a given switch 88 is actuated, for example by a logic high data bit of the signal TRIML, the corresponding trim current Itl generated by the trim current generator 82 coupled to the actuated switch 88 is supplied to the node 84 to be added to the constant current Isl and produce the sink current Isink output from the current sink circuit 30. When a given switch 88 is not actuated, the output of the trim current generator 82 is coupled to the ground supply node so as to shut off the current generator. The constant current generator 80 and trim current generators 82 may have any suitable current sourcing configuration known to those skilled in the art including, for example, an appropriately biased n-channel MOSFET device.

In an embodiment, the trim currents Itl1-Itln may have identical magnitudes. In another embodiment, the trim currents Itl1-Itln may have different magnitudes, perhaps having a binary relationship to each other. In a preferred embodiment, the magnitude of each trim current Itl1-Itln is a multiple of the magnitude of the constant current Isl.

Figure 6:
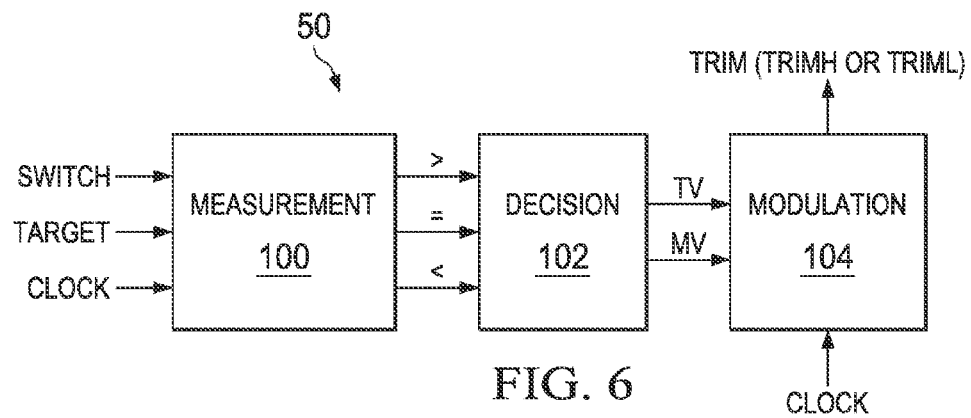
FIG. 6 illustrates a block diagram of a trimming circuit.

Reference is now made to FIG. 6 which illustrates a block diagram of the trimming circuit 50. The trimming circuit 50 comprises a measurement circuit 100, a decision circuit 102 and a modulation circuit 104.

The measurement circuit 100 receives the switch signal (SWITCH) output from the sawtooth signal generator 14, the clock reference signal (CLOCK) and the target signal (TARGET). The measurement circuit 100 functions to measure the length of the half period of the sawtooth oscillation signal Vosc-st and compare that measurement to a desired length of the half period set by the target signal. A first output (">") pulses logic high if the measurement indicates that the measured half period is greater than the target half period. A second output ("=") pulses logic high if the measurement indicates that the measured half period equals the target half period. A third output ("<") pulses logic high if the measurement indicates that the measured half period is less than the target half period.

The decision circuit 102 responds to the measured comparison (indicated by the outputs <, = and >) to define a modulation value (MV) and a trim value (TV). The modulation value is increased in response to the pulse of the first output (>), kept the same in response to the pulse of the second output (=), and decreased in response to the pulse of the third output (<). If the modulation value increases to a maximum value, the decision circuit 102 further responds to the measured comparison by increasing the trim value. Conversely, if the modulation value decreases to a minimum value, the decision circuit 102 further responds to the measured comparison by decreasing the trim value. It will accordingly be recognized that the trim value provides for a measure of course adjustment while the modulation value provides for a measure of fine adjustment.

The modulation circuit 104 generates the trimming signal (TRIM) in response to the modulation value (MV) and trim value (TV). Operation of the modulation circuit 104 is driven by the clock reference signal (CLOCK) and a predefined modulation period. The modulation period is preferably a length of time much shorter than the half period of the sawtooth oscillation signal Vosc-st.

The modulation circuit 104 takes a base trim value, corresponding to a fixed slope whose value is k, and integer modulation value ranging from 0 to a value which is one less than the modulation period. Assume that a minimum increase in the base value yields a slope y. The precision of the control exercised by the circuit over the slope of the generated ramp, and by extension to its period/frequency, is limited to k-y. The modulation circuit allow for a finer degree of resolution to be achieved in terms of average slope. By alternating between the slope k and slope y will produce, over time, an averaged slope lower than y but greater than k. As long as the averaging time is smaller than the period of the ramp, there is a real increase in the resolution of the generated slope. With these application constraints, the modulation circuit returns an averaged slope value equal to: (1−MODULATION_VALUE/MODULATION_PERIOD)×k+(MODULATION_VALUE/MODULATION_PERIOD)×y.

The trimming circuit 50 may be replicated and provided to generate separate trimming signals (TRIMH and TRIML) for the current source 20 and current sink 30 circuits of FIG. 1. In this regard, the target value (TARGET) may be the same for source and sink if the sawtooth oscillation signal Vosc-st is symmetric, or may be different if the sawtooth oscillation signal Vosc-st is asymmetric. If only one trimming circuit 50 is provided, measurements may be made on one or the other or both half periods of the sawtooth oscillation signal Vosc-st. Additionally, with one trimming circuit 50 provided, the generated trimming signal (TRIM) will provide both the current source trimming signal TRIMH and the current sink trimming signal TRIML (an the sawtooth oscillation signal Vosc-st will have a symmetric configuration).

Figure 7:
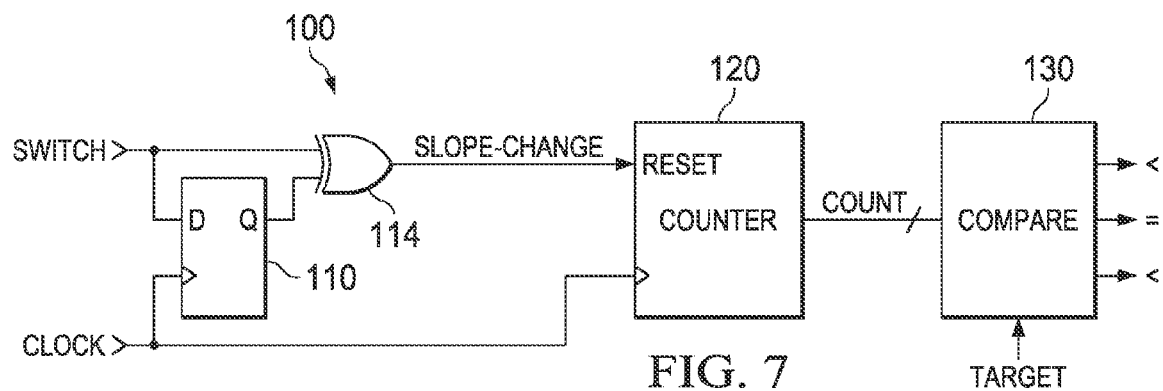
FIG. 7 illustrates a block diagram of a measurement circuit.

Reference is now made to FIG. 7 which illustrates a circuit diagram for the measurement circuit 100. A flip-flop 110 has a data input (D) coupled to receive the switch signal (SWITCH) output from the sawtooth signal generator 14. As noted above, the switch signal may comprise one of the SW-UP or SW-DOWN signals. The flip-flop 110 further includes a clock input coupled to receive the clock reference signal (CLOCK). The flip-flop 110 is preferably a D-type flip-flop and thus will generate and output the signal Q with each positive edge of the clock reference signal having a logic state which follows the logic state of the data input. An exclusive OR (i.e., XOR) logic gate 114 has a first input coupled to receive the switch signal and a second input coupled to receive the output Q. The logic gate 114 functions to generate a signal (SLOPE-CHANGE) including a pulse each time the switch signal changes state. Thus, because the switch signal changes state each time the slope of the sawtooth oscillation signal Vosc-st changes from positive to negative, the pulse of the SLOPE-CHANGE signal occurs once every half period of the sawtooth oscillation signal Vosc-st.

The measurement circuit 100 further includes a multi-bit counter 120 having a clock input and a reset input. The clock input of the multi-bit counter 120 is coupled to receive the clock reference signal (CLOCK). The reset input of the multi-bit counter 120 is coupled to receive the SLOPE-CHANGE signal. The pulse of the SLOPE-CHANGE signal causes the multi-bit counter 120 to reset to zero. Between consecutive pulses of the SLOPE-CHANGE signal, multi-bit counter 120 increments once for each positive edge of the clock reference signal. The multi-bit counter 120 further includes an output generating a multi-bit count output signal (COUNT) comprising the value of the multi-bit counter 120 each time the SLOPE-CHANGE signal causes a counter reset. Thus, the signal COUNT is a measure of the time between slope changes (i.e., the time of the half period of the sawtooth oscillation signal Vosc-st).

Figure 8A:
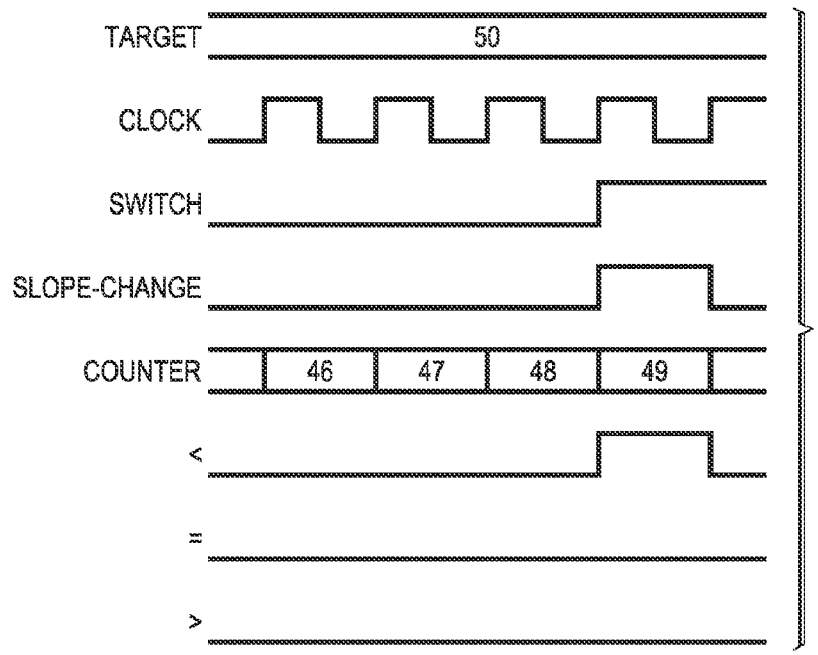
FIGS. 8A-8C illustrate operation of the measurement circuit.
Figure 8B:
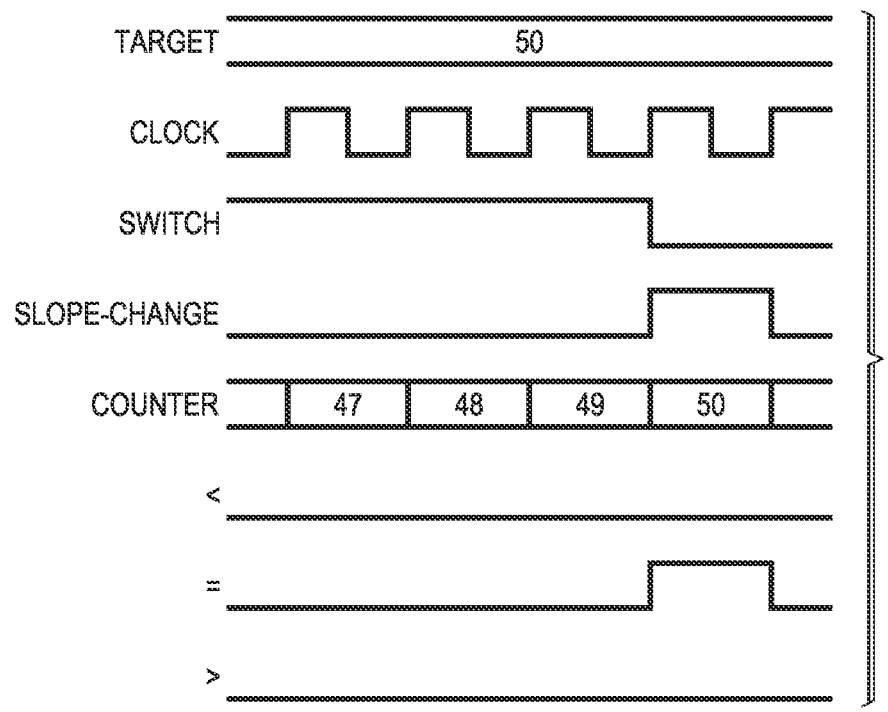
Figure 8C:
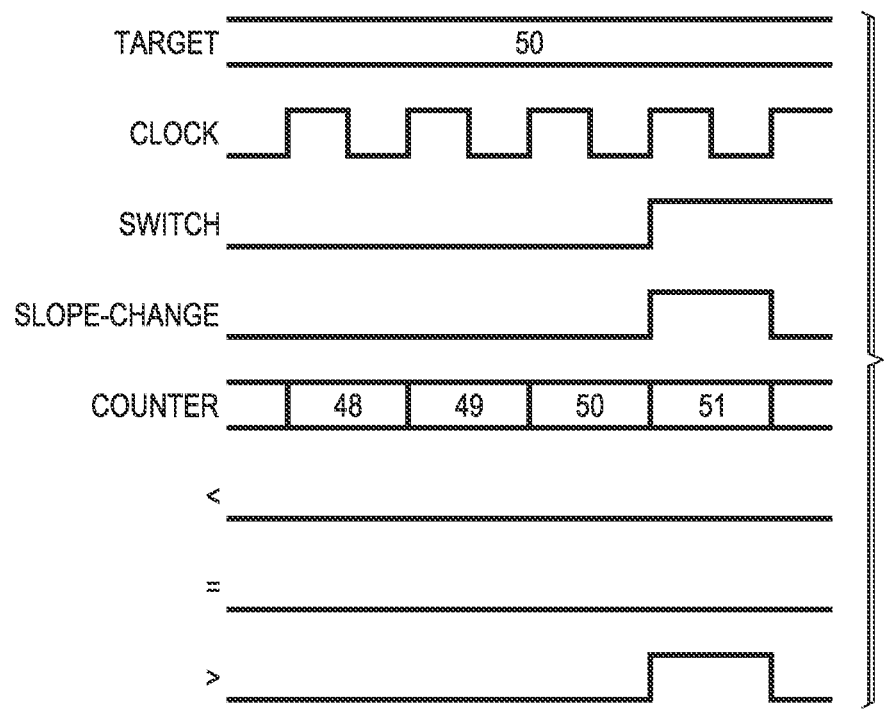

The measurement circuit 100 still further includes a comparison circuit 130. The comparison circuit 130 includes a first input coupled to receive the target signal (TARGET) which is a multi-bit digital signal having value set equal to the desired length of a half period of the sawtooth oscillation signal Vosc-st. The comparison circuit 130 further includes a second input coupled to receive the COUNT signal output from the multi-bit counter 120 at each pulse of the SLOPE-CHANGE signal (i.e., at the end of each half period of the sawtooth oscillation signal Vosc-st). The comparison circuit 130 comprises a multi-bit digital comparator circuit (having a configuration well known to those skilled in the art) with three outputs. The first output, referred to as the greater than (">") output, is set logic high by the comparator if the COUNT signal digital value is greater than the TARGET signal digital value (see FIG. 8A). The second output, referred to as the equal to ("=") output, is set logic high by the comparator if the COUNT signal digital value equals the TARGET signal digital value (see, FIG. 8B). The third output, referred to as the less than ("<") output, is set logic high by the comparator if the COUNT signal digital value is less than the TARGET signal digital value (see, FIG. 8C).

Figure 9:
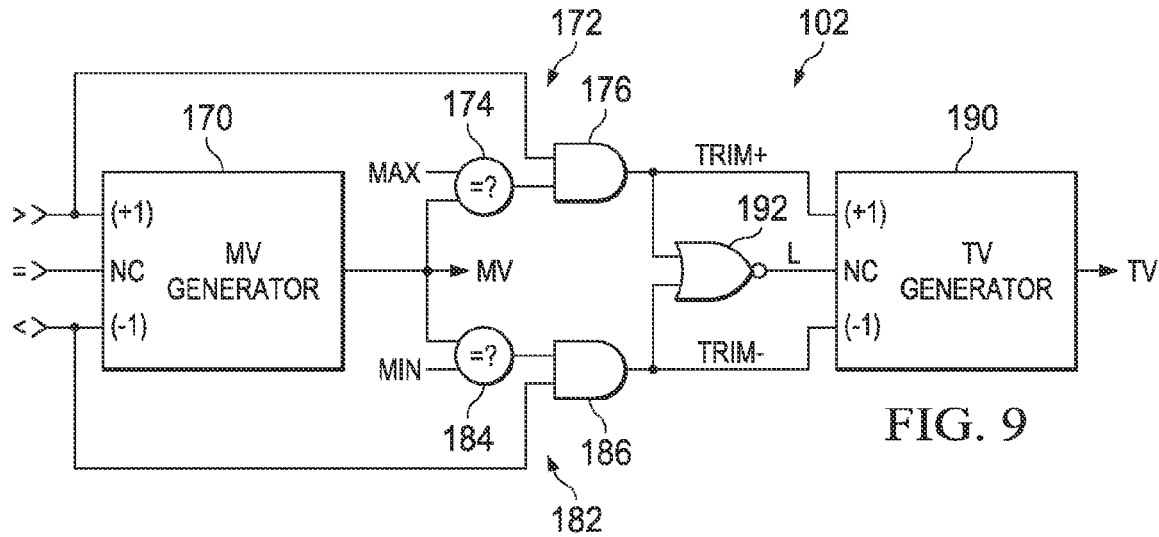
FIG. 9 illustrates a block diagram of a decision circuit.

Reference is now made to FIG. 9 which illustrates a block diagram of an embodiment of the decision circuit 102. The decision circuit 102 includes an MV generator 170 that receives the first (">") output, the second ("=") output and the third ("<") output and generates the modulation value (MV). The generator 170 functions as an increment/decrement logic circuit, known in the art, responsive to the first (">"), second ("=") and third ("<") signals. In response to a pulse of the first (">") output signal (indicating that half period of the sawtooth oscillation signal Vosc-st is greater than the target and the slope is too low), the increment function occurs within the generator 170 and the modulation value (MV) is incremented by one (+1). In response to a pulse of the second ("=") output signal (indicating that half period of the sawtooth oscillation signal Vosc-st equals the target and the slope is correct), the no change (NC) function occurs within the generator 170 and the modulation value (MV) is not altered. In response to a pulse of the third ("<") output signal (indicating that half period of the sawtooth oscillation signal Vosc-st is less than the target and the slope is too high), the decrement function occurs within the generator 170 and the modulation value (MV) is decremented by one (−1).

The decision circuit 102 further includes a maximum modulation value detection circuit 172. The circuit 172 includes a comparator 174 that tests whether the modulation value (MV) has reached a maximum modulation value (MAX). A logical AND gate 176 includes a first input configured to receive the first (">") output signal and a second input configured to receive the output of the comparator 174. If the modulation value (MV) equals MAX and the first (">") output signal pulses (i.e., both inputs logic high), the AND gate 176 generates a logic high trim increment signal (TRIM+).

The decision circuit 102 further includes a minimum modulation value detection circuit 182. The circuit 182 includes a comparator 184 that tests whether the modulation value (MV) has reached a minimum modulation value (MIN). A logical AND gate 186 includes a first input configured to receive the third ("<") output signal and a second input configured to receive the output of the comparator 184. If the modulation value (MV) equals MIN and the third ("<") output signal pulses (i.e., both inputs logic high), the AND gate 186 generates a logic high trim decrement signal (TRIM−).

The decision circuit 102 further includes a TV generator 190 that receives the trim increment signal (TRIM+), a lock signal (L) and the trim decrement signal (TRIM−) and generates the trim value (TV). The lock signal (L) is generated by logically combining the trim increment signal (TRIM+) and trim decrement signal (TRIM−). In particular, a logical not OR (NOR) gate 192 logically combines the TRIM+ and TRIM− signals to generate the lock signal (L). The generator 190 functions as an increment/decrement logic circuit, known in the art, responsive to the TRIM+, L and TRIM− signals. In response to a pulse of the trim increment signal (TRIM+) (indicating that the MV value is at MAX and the slope is too low because the half period of the sawtooth oscillation signal Vosc-st is greater than the target), the increment function occurs within the generator 190 and the trim value (TV) is incremented by one (+1). The MV value is incremented by one and overflows returning to a value of zero. In response to a pulse of the lock (L) signal (indicating that half period of the sawtooth oscillation signal Vosc-st equals the target and the slope is correct), the no change (NC) function occurs within the generator 190 and the trim value (TV) is not altered. In response to a pulse of the trim decrement signal (TRIM−) (indicating that the MV value is at MIN and the slope is too high because the half period of the sawtooth oscillation signal Vosc-st is less than the target), the decrement function occurs within the generator 190 and the trim value (TV) is decremented by one (−1). The MV value is decremented by one and underflows returning to the MAX value.

Thus, the TV value provides an integer part of the control and the MV value provides a fractional part of the control. In the example provided above when the MV value is incremented by one and overflows returning to a value of zero, the control may shift, for example, from 5+7/8 to 6+0/8. Conversely, in the example provided above when the MV value is decremented by one and underflows returning to the MAX value, the control may shift, for example, from 5+0/8 to 4+7/8.

Figure 10:
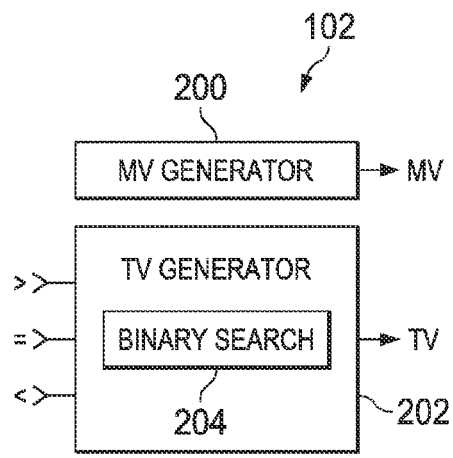
FIG. 10 illustrates a block diagram of a decision circuit.

Reference is now made to FIG. 10 which illustrates a block diagram of an another embodiment of the decision circuit 102. The decision circuit 102 includes an MV generator 200 configured to generate a fixed modulation value (MV). In other words, the modulation value (MV) does not change as a function of the measurement circuit 100. The modulation value (MV) may be pre-programmed in the MV generator 200 based upon a desired frequency of the sawtooth oscillation signal Vosc-st.

The decision circuit 102 further includes a TV generator 202 that receives the first (">") output, the second ("=") output and the third ("<") output and generates the trim value (TV). The generator 202 is implemented as a digital signal processor, microprocessor or other suitable calculating device configured to execute a binary search algorithm 204. Binary search algorithms are well known to those skilled in the art. Generally speaking, such algorithms function to find the value of an unknown variable (i.e., the next trim value (TV) by comparison of a current value to a reference with the result of the comparison indicating greater or smaller. The algorithm is slightly modified for use in the TV generator 202 to account for the case where the tested variable and the reference are equal, in which case the current trim value being tested is selected and output as the next trim value (i.e., no change).

The operation of the TV generator 202 with the binary search algorithm may be better understood by reference to the following examples which assume a trim range of 0 to 15.

Now, taking first Case A, a trim value of 7.3 would return a measured ramp equal to the target. Any greater trim value leads to a shorter measured time. In a first iteration of the algorithm, if the test TRIM_VALUE=7 and the signal > pulses high, this indicates that the ramp is slow and the ideal trim value is somewhere between 7 and 15. In a second iteration of the algorithm, the test TRIM_VALUE=11 because the signal > was high and ¼ of the full range (i.e., 16/4=4) was added to the previously tested value. In this case, the < signal pulses high indicating that the ramp is fast and the ideal trim value is somewhere between 7 and 11. In a third iteration of the algorithm, the test TRIM_VALUE=9 because the signal < was high and ⅛ of the full range (i.e., 16/8=2) was subtracted from the previously tested value. In this case, the < signal pulses high indicating that the ramp is still too fast and the ideal trim value is somewhere between 7 and 9. In a fourth iteration of the algorithm, the test TRIM_VALUE=8 because the signal < was high and 1/16 of the full range (i.e., 16/16=1) was subtracted from the previously tested value. In this case, the < signal pulses high indicating that the ramp is still too fast and the ideal trim value is somewhere between 7 and 8. Having reduced the difference to one, the binary search algorithm terminates. The modulation value will now start with a base trim value of 7 and modulation at 50%. This will produce a slope at 7.5. The tracking portion of the process will then drive the slope value to the target at 7.3.

Now consider a Case B. A trim value of 3 would return a measured ramp equal to the target. In a first iteration of the algorithm, if the test TRIM_VALUE=7 and the signal < pulses high, this indicates that the ramp is fast and the ideal trim value is somewhere between 0 and 7. In a second iteration of the algorithm, the test TRIM_VALUE=3 because the signal < was high and ¼ of the full range (i.e., 16/4=4) was subtracted from the previously tested value. In this case, the = signal pulses high indicating that the ramp is correct. The ramp value is now as desired and the ideal trim value is 3. The binary search algorithm terminates. The modulation value will now start with a base trim value of 3 and modulation at 0%. This will produce a slope at 3. The tracking portion of the process will then maintain the slope value at the target of 3.

The decision circuit 102 operates in two modes.

At first, the system may start with little or no information concerning the correct ramp characteristics. In a first mode, referred to as seeking mode, the decision circuit operates with the circuitry illustrated in FIG. 10. The modulation value is fixed by the generator 200 at 50%. In this mode of operation, only the trim value (TV) is changed based on the operation of the TV generator 202. The binary search algorithm modifies the trim value in a coarse adjustment operation to try and find the two values of the trim value which most closely approximate the desired ramp slope.

In a second mode, referred to as a tracking mode, the decision circuit operates with the circuitry illustrated in FIG. 9. The modulation value is calculated and updated by the generator 170 with each slope change. The trim value may be adjusted as well, from the value determined in the seeking mode, if the modulation value reaches either of the MIN or MAX values. This would indicate that a change to a new trim value (+1 or −1 different from the current value) is needed.

Figure 11:
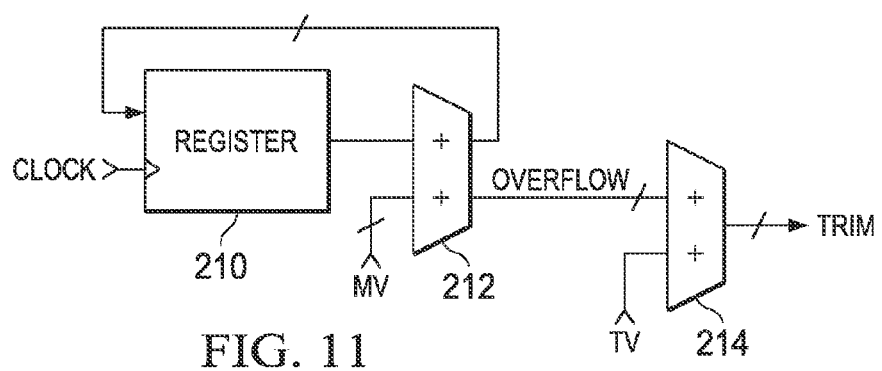
FIG. 11 illustrates a block diagram of a modulation circuit.

Reference is now made to FIG. 11 which illustrates a block diagram of the modulation circuit 104. The modulation circuit 104 includes a multi-bit register 210. The register 210 is configured to hold at most a predefined maximum value. For example, if the maximum value is eight, the register 210 is a three bit register whose maximum storable binary value is <111>. The register 210 includes a data input configured to receive a multi-bit signal. The register 210 further includes a load control input configured to receive the clock reference signal (CLOCK). The register 210 functions to store the data value present at the data input with each leading edge of the clock reference signal and make that stored data value available at an output of the register. In effect, the register 210 functions to latch the data value in response to the clock reference signal. The multi-bit output from the register 210 is received at a first input of a binary adder circuit 212. A second input of the binary adder circuit 212 receives the modulation value (MV). In a preferred embodiment, the register 210 stored data value and the modulation value (MV) have a same number of bits. The binary adder circuit 212 is configured with two outputs. A first output generates the multi-bit signal which is the binary addition of the data value and the modulation value (limited to that same number of bits). A second output generates an overflow signal (OVERFLOW) when the binary addition operation produces a value which exceeds that number of bits. The overflow signal is received at a first input of a second binary adder circuit 214. A second input of the second binary adder circuit 214 receives the trim value (TV). The second binary adder circuit generates the trimming signal (TRIM) which is applied to control operation of the sawtooth oscillator 14 (FIGS. 1, 5A and 5B).

The modulation period for the modulation circuit 104 is set by the predefined maximum value storable by the register 210. The modulation period is less than the half period of the sawtooth oscillation signal Vosc-st, and thus the value of the current Isource and/or Isink will be modulated many times within each half period so as to provide for an accurate ramp slope. The modulation value (MV) and trim value (TV) are fixed by the operation of the measurement circuit 100 and decision circuit 102 for the duration of the half period of the sawtooth oscillation signal Vosc-st. Indeed, the modulation value (MV) and trim value (TV) are update at each slope change based on the change in state of the SWITCH signal.

Figure 12:
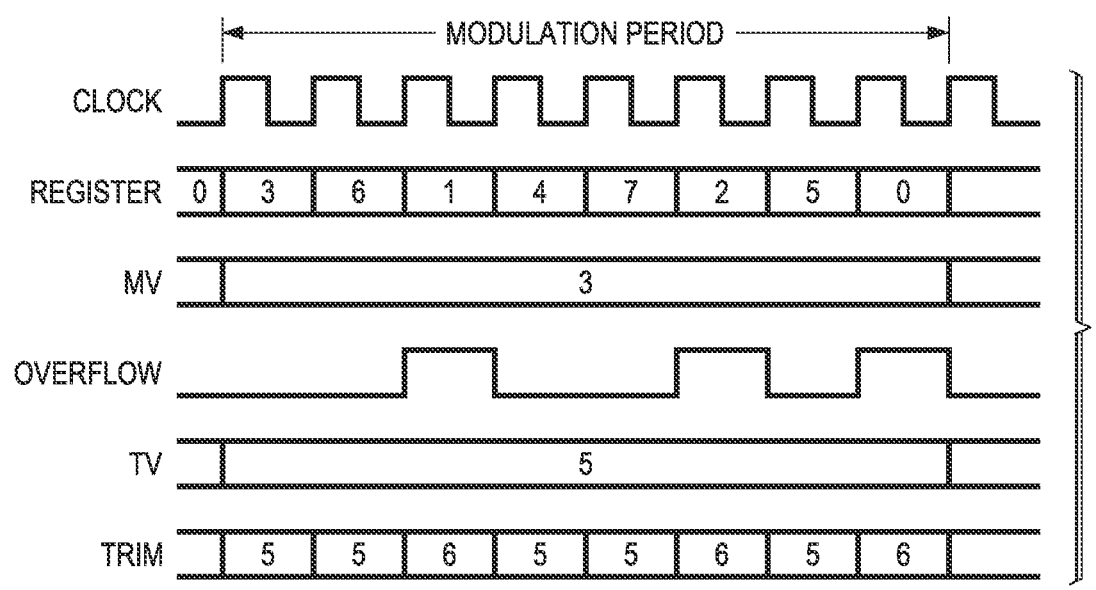
FIG. 12 illustrates operation of the modulation circuit.

Reference is now made to FIG. 12 which illustrates operation of the modulation circuit 104 for one modulation period. In this example, the decision circuit 102 has previously produced a modulation value (MV) of three (3) and a trim value (TV) of five (5), and the register is loaded with a value of zero (0). The register 210 can store a maximum binary value of seven.

At the beginning of the modulation period, through the operation of the binary addition circuit 212 (which receives the modulation value (MV=3) and the register output, the register 210 is loaded with a value of three (0+3=3) at the leading edge of a first clock pulse. The addition operation did not produce an overflow, so the OVERFLOW signal is logic low. Through the operation of the binary addition circuit 214 (which receives the trim value (TV=5), the trimming signal (TRIM) is output with a value of five (0+5=5). The output of the register 210 accordingly now has a signal with a value of 3.

At the second pulse, the binary addition circuit 212 adds the modulation value (MV=3) to the register output (3), and the register 210 is loaded with a value of six (3+3=6). The addition operation did not produce an overflow, so the OVERFLOW signal is logic low. Through the operation of the binary addition circuit 214 (which receives the trim value (TV=5), the trimming signal (TRIM) is output with a value of five (0+5=5). The output of the register 210 accordingly now has a signal with a value of 6.

At the third pulse, the binary addition circuit 212 adds the modulation value (MV=6) to the register output (3), and the register 210 is loaded with a value of one (6+3=1 with an overflow of 1). Because the addition operation produced an overflow, the OVERFLOW signal is logic high. Through the operation of the binary addition circuit 214 (which receives the trim value (TV=5), the trimming signal (TRIM) is output with a value of five (1+5=6). The output of the register 210 accordingly now has a signal with a value of 1.

The process is repeated until the end of the modulation period (i.e., after eight clock pulses). No further explanation is provided as the illustrated results in FIG. 12 may be obtained by analysis of the circuit and application of the example for the first three clock pulses as described above. The results, however, with respect to the generation of the trimming signal (TRIM) indicate that the trimming signal (TRIM) has a value which is modulated as a function of the modulation period and the value of the modulation value (MV). The higher the modulation value, the more frequently the binary addition circuit 212 will overflow and cause an increment by one of the trim value (TV). This operation will effectively produce a fractional value for the trimming signal (TRIM). In the FIG. 12 example, the fractional value of the trimming signal (TRIM) is 5+(3/8), where integer component is provided by the trim value (TV) and the fractional component is provided by the number of times within the modulation period that the modulation value (MV) caused the binary addition circuit 212 to overflow.

The effect of the operation of the circuit is to alternate between ramp slopes supported by the circuitry in an effort to produce an effective ramp slope that is between the supported slopes. For example, consider that in one configuration the circuit will produce a ramp with a slope of R1 and in another configuration the circuit will produce a ramp with a slope of R2. If the desired slope of the ramp, however, is between R1 and R2, the present circuit achieves the desired slope by changing operation of the ramp generator between R1 and R2. An example of this is shown in FIG. 12 with the trim value changing between a value of 5 (relating to the slope R1, for example) and a value of 6 (relating to the slope of R2, for example). As noted above, the illustrated example produces the desired slope with a value of 5+(3/8).

In the disclosure herein, operations of circuit embodiment(s) may be described with reference to method embodiment(s) for illustrative purposes. However, it should be appreciated that the operations of the circuits and the implementations of the methods in the disclosure may be independent of one another. That is, the disclosed circuit embodiments may operate according to other methods and the disclosed method embodiments may be implemented through other circuits.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A ramp generator circuit, comprising:
a capacitor;
a current source circuit configured to generate a source current having a variable magnitude;
a first switch configured to selectively apply the source current to the capacitor and generate a ramp signal at said capacitor; and
a trimming circuit configured to measure a time taken for the ramp signal to reach a threshold, compare the measured time to a reference time and adjust the variable magnitude of the source current in response to a result of the comparison.

2. The circuit of claim 1, wherein the current source circuit comprises a plurality of trim current sources each generating a trim current, and wherein said trimming circuit is configured to adjust the variable magnitude of the source current by selectively applying the trim currents from the plurality of trim current sources to the capacitor.

3. The circuit of claim 1, further comprising a switch control circuit configured to actuate the first switch at a beginning of the ramp signal and deactuate the first switch when the high threshold is reached.

4. The circuit of claim 3, wherein the trimming circuit comprises a measurement circuit configured to count a number of clock cycles between actuation and deactuation of the first switch and compare to count to the reference time to generate an error signal.

5. The circuit of claim 4, wherein the trimming circuit further comprises a trimming signal generator configured to generate a trimming signal which sets the variable magnitude of the source current in response to the error signal.

6. The circuit of claim 5, wherein the trimming signal generator is further configured to modulate the trimming signal within a modulation period having a duration less than the reference time.

7. The circuit of claim 5, wherein the trimming signal generator comprises:
a decision circuit responsive to the error signal and configured to generate a trim value and a modulation value; and
a modulation circuit configured to generate the trimming signal with a coarse adjustment value set in response to the trim value and a fine tuning adjustment value set in response to the modulation value.

8. The circuit of claim 7, wherein the decision circuit comprises:
a modulation value generator configured to adjust the modulation value in response to the error signal;
a trim value generator configured to adjust the trim value in response to a combination of the error signal and whether the modulation value has reached a threshold.

9. The circuit of claim 8, wherein the error signal indicates whether the measured time is greater than the reference time, whether the measured time equals the reference time and whether the measured time is less than the reference time.

10. The circuit of claim 9, wherein the modulation value is increased if the measured time is greater than the reference time, is not changed if the measured time equals the reference time and is decreased if the measured time is less than the reference time.

11. The circuit of claim 9, wherein the trim value is increased if the measured time is greater than the reference time and the modulation value has reached a maximum and is decreased if the measured time is less than the reference time and the modulation value has reached a minimum.

12. The circuit of claim 7, wherein the modulation circuit comprises:
a register;
a first adder circuit configured to add the modulation value to a value stored in the register and store the result in the register and further generate an overflow signal if the addition performed by the first adder circuit overflows; and
a second adder circuit configured to add the overflow signal to the trim value to generating the trimming signal.

13. An oscillator circuit, comprising:
a capacitor;
a current source circuit configured to generate a source current having a variable magnitude;
a first switch configured to selectively apply the source current to the capacitor and generate a positive ramp of an oscillator signal at said capacitor;
a current sink circuit configured to generate a sink current having a variable magnitude;
a second switch configured to selectively apply the sink current to the capacitor and generate a negative ramp of the oscillator signal at said capacitor;
a switch control circuit configured to alternately actuate the first and second switches;
a trimming circuit configured to measure a half period of the oscillator signal, compare the measured half period to a reference period and adjust the variable magnitude of the source current and sink current in response to a result of the comparison.

14. The circuit of claim 13, wherein each of the current source circuit and current sink circuit comprises a plurality of trim current sources generating trim currents which are selectively applied to the capacitor in response to the variable magnitude adjustment of the trimming circuit.

15. The circuit of claim 13, wherein the trimming circuit comprises:
a measurement circuit configured to generate an error signal in response to the comparison of the measured half period to the reference period; and
a trimming signal generator configured to generate a trimming signal which sets the variable magnitude in response to the error signal.

16. The circuit of claim 15, wherein the trimming signal generator comprises:
a decision circuit responsive to the error signal and configured to generate a trim value and a modulation value; and
a modulation circuit configured to generate the trimming signal with a coarse adjustment value set in response to the trim value and a modulated fine tuning adjustment value set in response to the modulation value.

17. The circuit of claim 16, wherein the modulation circuit comprises:
a register;
a first adder circuit configured to add the modulation value to a value stored in the register and store the result in the register and further generate an overflow signal if the addition performed by the first adder circuit overflows; and
a second adder circuit configured to add the overflow signal to the trim value to generating the trimming signal.

18. A method of generating a ramp signal, comprising:
applying a source current having a variable magnitude to a capacitor to generate a ramp signal at said capacitor;

measuring a time taken for the ramp signal to reach a threshold;

comparing the measured time to a reference time; and adjusting the variable magnitude of the source current in response to a result of the comparison.

19. The method of claim 18, wherein comparing comprises generating an error signal indicative of a difference between the measured time taken and wherein adjusting comprises generating a trimming signal which sets the variable magnitude of the source current in response to the error signal.

20. The method of claim 19, wherein adjusting further comprises modulating the trimming signal.

21. The method of claim 19, wherein adjusting comprises:

generating a trim value and a modulation value responsive to the error signal; and wherein said trimming signal has a coarse adjustment value set in response to the trim value and a modulated fine tuning adjustment value set in response to the modulation value.

* * * * *

UNITED STATES PATENT AND TRADEMARK OFFICE
CERTIFICATE OF CORRECTION

PATENT NO. : 8,963,589 B1  
APPLICATION NO. : 14/152270  
DATED : February 24, 2015  
INVENTOR(S) : Lorenzo Ferrario et al.

Page 1 of 1

It is certified that error appears in the above-identified patent and that said Letters Patent is hereby corrected as shown below:

On the Title page, Item (73) should read as follows:

-- (73) Assignees: STMicroelectronics, S.r.l., Agrate Brianza (MB) (IT); STMicroelectronics Asia Pacific Pte. Ltd., Singapore (SG).--

Signed and Sealed this  
Ninth Day of June, 2015

Michelle K. Lee  
*Director of the United States Patent and Trademark Office*